United States Patent [19]

Cargile et al.

[11] 4,001,679
[45] Jan. 4, 1977

[54] WEDGE ACTION ELECTRICAL TEST PROBE

[76] Inventors: William P. Cargile, 206 El Granada Blvd., Half Moon Bay, Calif. 94019; W. Andrew Morrison, 12297 Via Roncole, Saratoga, Calif. 95070

[22] Filed: Feb. 19, 1975

[21] Appl. No.: 551,138

[52] U.S. Cl. .................. 324/72.5; 339/108 TP; 339/74 R; 324/149; 324/158 P
[51] Int. Cl.² .................. G01R 31/02; H01R 13/00
[58] Field of Search ............. 324/72.5, 149, 158 P; 339/32 R, 33, 74 R, 108 R, 108 TP, 203

[56] References Cited
UNITED STATES PATENTS

| | | | |
|---|---|---|---|
| 3,108,842 | 10/1963 | Gorman | 339/108 |
| 3,182,257 | 5/1965 | Linkowski | 324/149 |
| 3,648,221 | 3/1972 | Tillmann et al. | 339/74 R |

FOREIGN PATENTS OR APPLICATIONS

1,955,414  7/1970  Germany

OTHER PUBLICATIONS

"Scope Probe," E. T. Heitzman IBM Tech. Discl. Bulletin, vol. 7, No. 5, Oct. 1964, pp. 393–394.
Kurtz, "Probe and Probe Head for Tester," IBM Tech. Discl. Bulletin, vol. 9, No. 11, Apr. 1967, pp. 1507–1508.

*Primary Examiner*—Palmer C. Demeo
*Assistant Examiner*—Vincent J. Sunderdick
*Attorney, Agent, or Firm*—Thomas H. Olson

[57] ABSTRACT

A test probe for effecting temporary electrical connection to circuit terminals of miniature integrated circuits or like elements with small inter-terminal spacings. The probe has an insulative tip having a cross-sectional dimension smaller than the space between adjacent terminals. In an axially extending groove in the tip is a stiff wire, and a mechanism is provided for controllably moving the wire out of the groove after the tip has been inserted between two terminals. When the wire moves out of the groove, it contacts one of the electric terminals and wedges the insulative tip against the adjacent terminal so as to retain the probe in place.

7 Claims, 5 Drawing Figures

U.S. Patent  Jan. 4, 1977  4,001,679
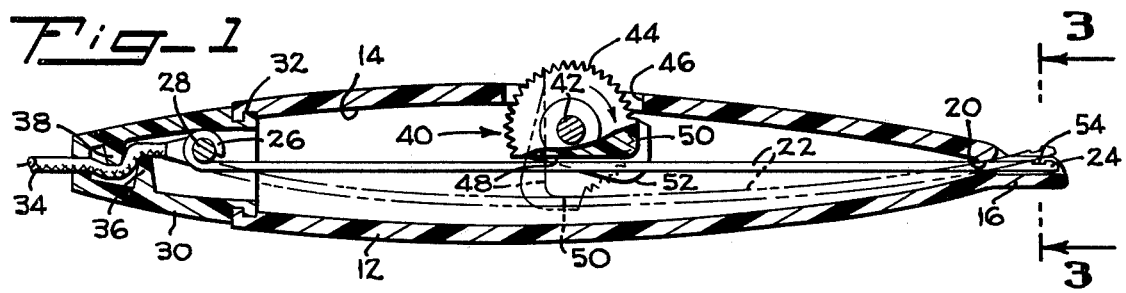
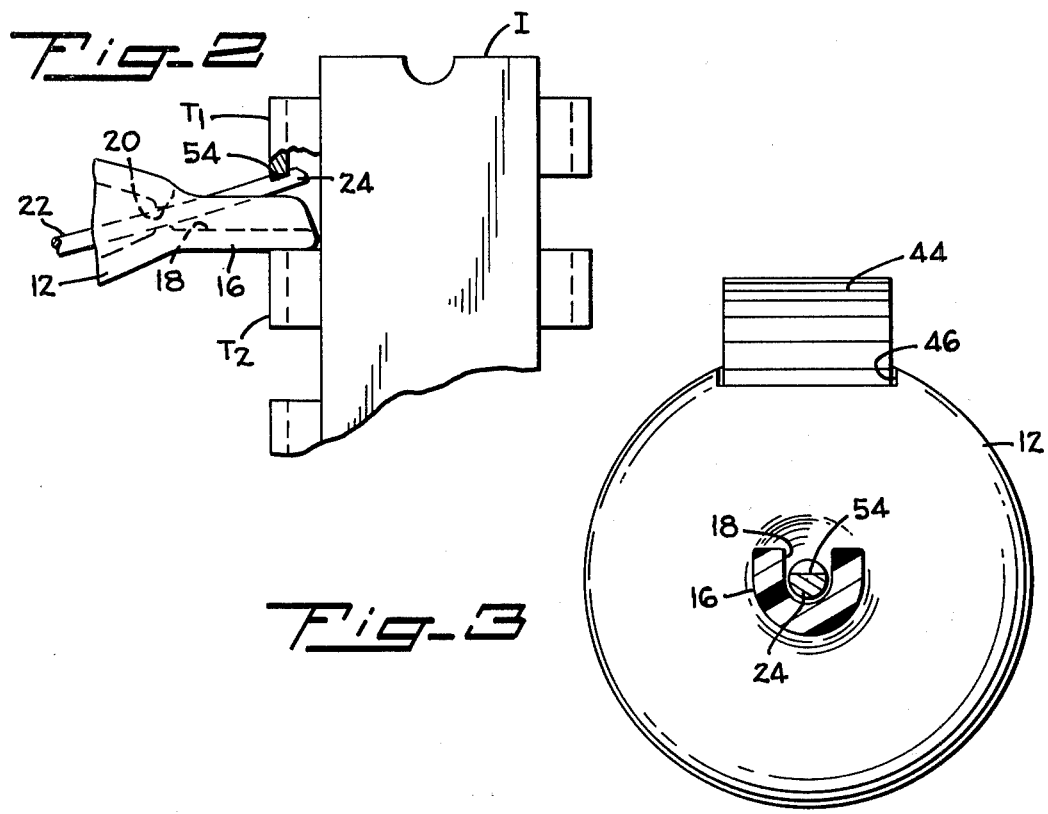
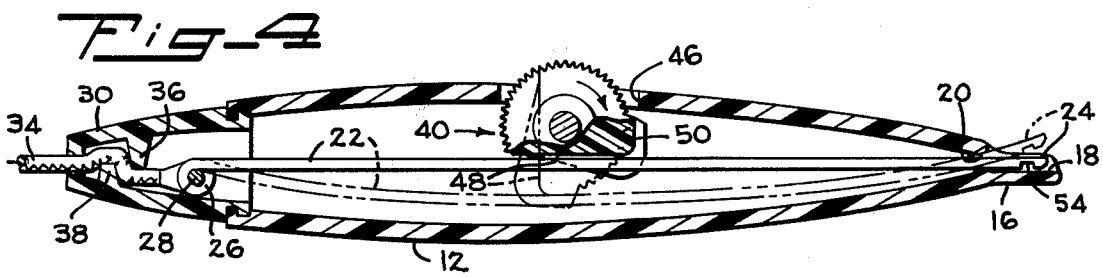
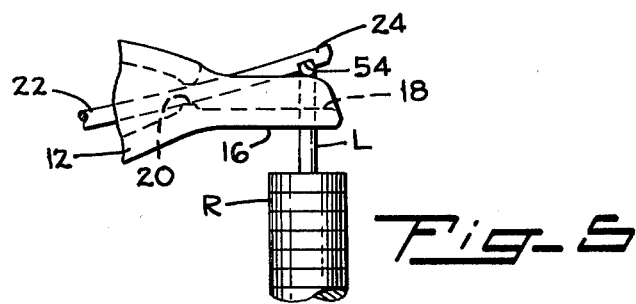

WEDGE ACTION ELECTRICAL TEST PROBE

BACKGROUND OF THE INVENTION

1. Field of the Invention

This invention relates to a test probe for effecting temporary connection between a test instrument and a point in an electronic circuit and more particularly to a test probe that effects secure connection to one of two or more terminals that are closely spaced with respect to one another without danger of inadvertently short-circuiting the terminals.

2. Description of the Prior Art

Although no prior art that discloses a test probe employing a wedge action principle is known, the following U.S. Patents disclose test probes and evidence the state of the art: U.S. Pat. Nos. 2,969,519; 3,182,257; 3,447,078; 3,646,579 and 3,768,005.

SUMMARY OF THE INVENTION

An unfilled need that has arisen from the proliferation of large scale integrated circuits is a test probe for effecting connection to circuit points such as integrated circuit terminals without shorting the terminals during insertion and use of the probe. This is particularly important in digital systems employing such integrated circuits, where in certain instances it has been necessary to interrupt the power to the equipment, attach the probe, and then restore the power. During interruption of power to the equipment, the state of the digital elements in the circuit typically returns to zero or some other start position, and before the appropriate test conditions can be achieved, the circuitry must be cycled through numerous steps. The probe of the invention, because it can be connected without danger of short circuiting closely adjacent terminals, eliminates the necessity of turning off the equipment, thereby expediting the testing of digital equipment of the type employing numerous integrated circuit elements.

The specific embodiment of the present invention that is disclosed in more specific detail hereinbelow includes a hollow insulative probe housing having extending from one end thereof and preferably integral therewith an insulative probe tip. The tip defines an axially extending groove which communicates through an opening with the interior of the housing. A conductive spring wire has its main portion disposed within the housing and a distal tip portion extending through the opening and lying within the groove. Within the housing is a cam member for deforming the wire in a radial direction; in consequence of such deformation the distal portion of the wire moves outward of the groove in a pivoting motion about a fulcrum defined by a shoulder that surrounds the opening between the groove and interior of the housing. When the distal portion of the wire moves out of the groove in the insulative body tip, it contacts one electric terminal and wedges the surface of the probe tip opposite the groove against an adjacent terminal. Thus both mechanical and electrical connection are established with one and only one of the circuit terminals.

An object of the present invention is to provide a test probe that can be connected to one of two or more closely spaced electric terminals without shorting or establishing electrical connection between such terminals. This object is achieved by providing an insulative probe tip that has a cross-sectional dimension less than the space between the electric circuit terminals. The conductive portion of the probe lies below the surface of the insulative probe body tip so that when the probe is being inserted into position there is little or no likelihood of contact with the terminals. When the probe is in a proper position the distal portion of the conductive wire is caused to move out of the groove and into contact with the desired terminal.

Another object of the present invention is to provide a test probe having the above mentioned characteristics which will remain in place in a circuit without operator attention so that the operator can use both hands for calibrating the test instrument to which the probe is connected. This object is achieved because the distal portion of the conductive spring wire is urged outward of the tip groove by a resilient or spring force, which affords a continuous wedging force against two adjacent terminals. The resilient force is produced by fixing the extremity of the conductive spring wire remote from the distal portion and the fulcrum, and providing a camming mechanism for deforming a medial region of the spring wire away from its unstressed straight condition. The portion of the spring wire between the camming mechanism and the fulcrum is stressed so as to produce the resilient wedging force between the probe tip and the distal portion of the wire. The camming mechanism is arranged to permit connection and disconnection of the probe by only one hand.

Contributing to achievement of the above stated object is a notch in the distal portion of the spring conductor in which an edge of the circuit terminal can reside when the probe is wedged in place.

A further object of the present invention is to provide a probe that affords the above mentioned wedging action as well as the more conventional clamping action. Accomplishment of this object is possible because the inner extremity of the spring wire is fixed to a turret which is supported for rotation relative the main probe housing. When the turret is rotated 180° from the position referred to hereinabove, the notch in the tip of the wire confronts or faces the groove in the insulative probe tip. Thus, when the cam mechanism is operated to pivot the wire outward of the groove, the probe can be placed over a conductor or like circuit point, and release of the cam mechanism causes the circuit conductor to be resiliently embraced between the insulative probe tip and the wire.

The foregoing together with other objects, features and advantages of the present invention will be more apparent after referring to the following specification and accompanying drawing.

BRIEF DESCRIPTION OF THE DRAWING

FIG. 1 is a cross-sectional view of a probe embodying the present invention wherein the inactive position is shown in solid lines and the active position is shown in broken lines.

FIG. 2 is a fragmentary view at enlarged scale of the tip of the probe of FIG. 1 in place on an integrated circuit terminal.

FIG. 3 is a cross-sectional view at enlarged scale taken along line 3—3 of FIG. 1.

FIG. 4 is a view of the probe of FIG. 1 showing probe arranged for compressive engagement of a circuit element to be tested.

FIG. 5 is a fragmentary view at an enlarged scale showing the probe of FIG. 4 in position on a circuit element.

DESCRIPTION OF THE PREFERRED EMBODIMENT

Referring more particularly to the drawing, reference numeral 12 indicates the main housing for the probe of the invention. Housing 12 is constructed of any suitable insulative material, such as molded synthetic thermoplastic material, and has a hollow interior which defines a cavity 14. Extending from one end of housing 12 and preferably integral therewith is a probe body tip portion 16 which has a cross-sectional dimension, as shown in FIG. 2, sufficiently small to enter between two terminals $T_1$ and $T_2$ of an integrated circuit element I. Tip 16 defines an axially extending concavity or groove 18 which communicates with cavity 14 through an aligned opening defined by annular shoulder 20 between the groove and the cavity. Disposed within housing 14 and extending through the opening defined by shoulder 20 is a conductive spring member 22, the distal end 24 of which is sized to fit through the opening defined by shoulder 20 and reside within groove 18. Conductive member 22 is preferably a resilient spring wire and has at the extremity thereof opposite distal end 24 a loop 26 which circumscribes a cross pin 28.

Cross pin 28 is rigid with and preferably integral with a turret 30 which can be formed of the same material as housing 12. Turret 30 is fixed to housing 12 at an annular tongue and groove joint 32 which permits the turret to be rotated about a longitudinal axis relative to the housing. A flexible conductor 34 is mechanically and electrically connected to conductive member 22 at loop 26, there being overlapping axially spaced protuberances 36 and 38 within turret 30 for relieving strain on the electrical connection between the conductor and spring member 22.

When spring member 22 is in a straight unstressed or undeformed condition, shown in solid lines in FIG. 1, distal portion 24 thereof resides within groove 18 of probe tip 16. Accordingly, in such position the probe tip can be introduced between terminals $T_1$ and $T_2$ without inadvertent electrical contact between the conductive spring member and the terminals. When the spring member is radially deformed to the position shown in broken lines in FIG. 1, distal portion 24 projects outward of groove 18 because the conductive member pivots at shoulder 20 and experiences a scissor-like movement as seen most clearly in FIG. 2.

For controllably deforming conductive element 22 the invention provides a control knob 40 which is supported for rotative movement on a shaft 42 which extends transversely of conductive spring wire 22 and is preferably integral with housing 12. Knob 40 has a roughened or knurled periphery 44 which is accessible from the exterior of housing 12, there being a slot or opening 46 in the housing through which a portion of the periphery projects so that the knob can be rotated about the axis of shaft 42. Because the axis of rotation of knob 42 is transverse to the longitudinal axis of housing 12, tangential force applied to knob periphery 44 is oriented parallel to the longitudinal axis, thereby facilitating one hand operation. Knob 40 has a chordally extending camming surface 48 which in the position shown in solid lines in FIG. 1 is spaced from the central axis of housing 12 so as to permit conductive member 22 to assume an unstressed position coextensive with the axis. The control knob has a second chordally extending camming surface 50 which is oriented at about 90° from surface 48 and is spaced from the axis of shaft 42 by a greater distance so as to deform and stress conductive spring member 22 to the broken line position of FIG. 1 in response to rotation of knob 40 through a 90° arc. For maintaining conductive spring member 22 in contact with camming surfaces 48 and 50, knob 40 includes walls parallel to the plane of the paper on which FIG. 1 is drawn and disposed on either side of the surfaces, one such wall being indicated at 52. Knob 40 is preferably located at about the longitudinal center of housing 12 for two reasons. First, so that the knob can be controlled by the operator's thumb, and second so that there is a substantial span of conductive spring wire 22 between the knob and shoulder 20 which can yield to permit wedge action between terminals of different relative spacings. Because shoulder 20 has a limited longitudinal extent, it permits pivotal or scissor-like movement of distal portion 24 in response to rotation of the knob.

In operation the probe of the present invention can be used to effect connection between terminal $T_1$ of integrated circuit I and a test instrument connected to the remote end of conductor 34 by first positioning knob 40 in the position shown by solid lines in FIG. 1. In such position conductive member 22 resides in an unstressed straight line position axially of housing 12 so that the distal portion 24 of the conductive member resides within groove 18 of tip 16. As seen most clearly in FIG. 3, there is virtually no possibility of electrical contact between the conductive spring member and any of the circuit terminals, because the conductive member is substantially surrounded and enclosed by probe tip 16, which is constructed of insulative material. With the probe in such position, tip 16 can be positioned intermediate terminals $T_1$ and $T_2$, and the probe rotated such that groove 18 faces or confronts terminal $T_1$. Knob 40 is then rotated in the clockwise direction of the arrow of FIG. 1, such rotation being easily effected by the thumb of one hand. Rotation of the knob deforms and stresses the central or medial region of conductive spring member 22 into the arcuate form shown by broken lines in FIG. 1. The consequence of such deformation of the conductive spring member is that distal end 24 moves outward of groove 18 in a scissor-like movement about a fulcrum or pivot point defined by shoulder 20. Thereupon the distal end of the conductive member electrically and mechanically engages terminal $T_1$ and wedges the surface of probe tip 16 remote from groove 18 into contact with terminal $T_2$. The opening defined by shoulder 20 affords a sufficient degree of sliding axial movement and pivoting movement so that the energy stored in the portion of spring wire 22 between knob 40 and the shoulder is effective to apply a continuous wedge force between distal portion 24 and tip 16. A notch 54 adjacent the outer extremity of distal portion 24 defines an abutment surface transversely of the distal portion which engages terminal $T_1$ and assists in retaining the probe in the position shown in FIG. 2. With the probe in the engaged position, appropriate tests can be performed by manipulation of the instrument connected to the remote end of conductor 34.

When the test is completed, knob 40 is rotated in a counter-clockwise direction as viewed in FIG. 1, whereupon conductive member 22 is restored to an axial or straight position and distal portion 24 re-enters groove 18 and is substantially insulated by insulative probe tip 16 to afford safe and simple removal of the probe from the circuit. Thus the circuit of which integrated circuit I is a part can be tested without discontinuing operation of the circuit because probe of the invention virtually eliminates the danger of shorting out two adjacent terminals.

The probe of the invention has the capability, as do certain of the probes described in the above cited prior art, of more conventional operation i.e. of effecting connection by clamping or embracing a conductor in a circuit. To operate the probe in this mode of operation housing 12 and turret 30 are rotated relative one another through 180° until they bear the relative position shown in FIGS. 4 and 5. In this position notch 54 in distal portion 24 faces or confronts the bottom of groove 18 in probe tip 16. With the turret so positioned with respect to housing 12, efficient connection can be made to a lead L of a resistor R by rotating knob 40 to bring camming surface 50 into contact with conductive spring member 22. This arcuately deforms the conductive spring member and moves distal portion 24 of the conductive member outward of groove 18 in a scissor-like movement. When the tip 16 and distal portion 24 are positioned over lead L as shown in FIG. 5, knob 40 is rotated in a counter-clockwise direction as seen in FIG. 4 so as to permit conductive member 22 to move toward the axial position within housing 12. Because the portion of conductive spring member 22 within housing 12 is stressed, a clamping force is applied between distal portion 24 and tip 16 which, together with engagement of lead L in notch 54, securely retains the probe tip in place on the circuit point constituted by Lead L. Thereupon appropriate tests are performed and removal of the probe is achieved by rotating knob 40 in a clockwise direction so that camming surface 50 deforms conductive member 22 away from the axial position and pivots the distal portion 24 away from tip 16. Of course if lead L is in a very crowded environment, such as a circuit board, it may well be desirable after the probe is disengaged from lead L to restore knob 40 to the counter-clockwise position so that distal portion 24 enters groove 18 in probe 16 to permit removal of the probe without danger of shorting adjacent conductors or circuit points.

Thus it will be seen that the present invention provides a test probe for effecting connection to circuit points which may be disposed in a very crowded environment and may be closely spaced to adjacent conductive circuit points. Efficient and rapid connection is achieved without danger of shorting adjacent conductive circuit points because distal portion 24 resides in groove 18 of insulative probe tip 16 until the probe tip is positioned as desired. Because of the location and the construction of knob 40 the probe lends itself to extremely facile one hand operation. Moreover the presence of turret 30 and its ability to rotate relative housing 12 permits the probe to be used in either a wedging fashion or a clamping fashion. Although one embodiment of the invention has been shown and described it will be obvious that other adaptations and modifications can be made without departing from the true scope and spirit of the invention.

What is claimed is:

1. A probe for effecting temporary electrical connection to one of two spaced apart terminals comprising a housing having a wall defining a cavity, an elongate insulative body rigid with said housing, said housing having an opening communicating with said cavity defining a shoulder adjacent said body, a conductive spring wire having a distal end extending through said opening, a medial region residing within said cavity and a remote end remote from said distal end, means for fixing said remote end to said housing at a point remote from said insulative body, and means for biasing said conductive body pivotally outward of said insulative body to afford wedging action between the two spaced apart terminals, said biasing means comprising means disposed in said housing for laterally deforming said medial region of said conductive spring within said cavity, said shoulder being longitudinally limited so as to afford pivotal movement of said conductive member relative said insulative member in response to deformation of said conductive spring by said deforming means.

2. A probe according to claim 1 wherein said distal portion includes a notch in one lateral surface thereof, and wherein said housing includes a turret mounted for rotation about an axis coaxial with said groove, said first extremity fixing means being secured to said turret so that the orientation of said notch relative said groove can be altered by rotation of said turret on said axis.

3. A probe according to claim 2 including a flexible conductor for effecting electrical connection between said probe and a test instrument, said conductor having one end connected to said conductive spring wire at said first extremity fixing means.

4. A probe according to claim 1 wherein said deforming means comprises a knob disposed in said housing and means for mounting said knob for rotative movement about an axis spaced from said conductive spring, said knob having first and second circumferentially spaced camming surfaces extending chordally of said axis, said first surface being radially spaced from said axis by an amount sufficient to arcuately deform the medial region of said conductive spring and said second surface being radially spaced from said axis by an amount sufficient to permit said conductive spring to assume a substantially straight unstressed condition within said housing.

5. A probe according to claim 4 wherein said housing wall defines an opening adjacent said knob, said knob having a peripheral portion extending through last said opening for affording access to said knob from exterior said cavity.

6. A probe according to claim 5 wherein said knob axis is oriented transversely of said conductive spring so that tangential force on said extending peripheral knob portion to effect rotation of said knob is directed parallel to the longitudinal axis of said housing, thereby facilitating one hand operation of said probe.

7. A test probe for effecting temporary electrical connection to a first terminal that is closely spaced apart from a second terminal, said terminals having respective edges that confront one another across said space, said probe comprising an elongate rigid insulative body having a cross-sectional dimension sized for entry between said terminals, said body having a generally U-shaped cross-sectional shape and defining a laterally exposed axially extending groove so that said groove can be positioned in alignment with said first terminal when said body is positioned intermediate said terminals, an elongate conductive member mounted in said body and being dimensioned to reside along and totally within said groove, said elongate conductive member having an extremity, and means for controllably biasing said extremity of said conductive member out of said groove and away from said body into contact with the edge of said first terminal so that said probe is wedged between said terminals with a portion of said body opposite said groove contacting the edge of said second terminal.

* * * * *